(12) United States Patent
Miyawaki et al.

(10) Patent No.: US 9,373,730 B2
(45) Date of Patent: Jun. 21, 2016

(54) METHOD AND APPARATUS FOR MANUFACTURING OPTICAL DEVICE

(75) Inventors: Yoshiteru Miyawaki, Takatsuki (JP); Jun Oki, Takatsuki (JP); Daisuke Kounou, Osaka (JP); Nobuhiko Iwasaki, Nagoya (JP)

(73) Assignee: SANYU REC CO., LTD., Takatsuki-Shi, Osaka (JP)

( * ) Notice: Subject to any disclaimer, the term of this patent is extended or adjusted under 35 U.S.C. 154(b) by 110 days.

(21) Appl. No.: 14/113,944

(22) PCT Filed: Apr. 19, 2012

(86) PCT No.: PCT/JP2012/060586
§ 371 (c)(1),
(2), (4) Date: Oct. 25, 2013

(87) PCT Pub. No.: WO2012/147611
PCT Pub. Date: Nov. 1, 2012

(65) Prior Publication Data
US 2014/0051196 A1 Feb. 20, 2014

(30) Foreign Application Priority Data
Apr. 26, 2011 (JP) ................................. 2011-098741

(51) Int. Cl.
*H01L 21/00* (2006.01)
*H01L 31/0203* (2014.01)
(Continued)

(52) U.S. Cl.
CPC ............ *H01L 31/0203* (2013.01); *H01L 33/54* (2013.01); *H01L 33/58* (2013.01); *H01L 2933/005* (2013.01)

(58) Field of Classification Search
CPC .................................................. H01L 31/0203

USPC .......................................................... 438/27
See application file for complete search history.

(56) References Cited

U.S. PATENT DOCUMENTS 6,126,428 A * 10/2000 Mitchell et al. ................ 425/110
2003/0033525 A1* 2/2003 Rajaram ........................ 713/168
(Continued)

FOREIGN PATENT DOCUMENTS

EP 2128201 A1 12/2009
EP 2302283 A2 3/2011
(Continued)

OTHER PUBLICATIONS

International Search Report of International Application No. PCT/JP2012/060586, mailed Jul. 3, 2012, 2 pages.
(Continued)

*Primary Examiner* — Matthew Landau
*Assistant Examiner* — Igwe U Anya
(74) *Attorney, Agent, or Firm* — Sterne, Kessler, Goldstein & Fox P.L.L.C.

(57) ABSTRACT

An optical device manufacturing apparatus includes an encapsulating device for encapsulating an optical semiconductor element 4 mounted on a substrate 2 by a liquid resin R in a lens shape, and a curing device for curing the liquid resin R, wherein the encapsulating device includes a dispenser capable of vertically moving a nozzle 25 for supplying the liquid resin R, and brings the tip of the nozzle 25 close to the optical semiconductor element 4 and then supplies the liquid resin R while raising the nozzle 25. According to this optical device manufacturing apparatus, an optical device having the desired optical properties can be obtained promptly and easily.

10 Claims, 10 Drawing Sheets

(51) Int. Cl.
*H01L 33/54* (2010.01)
*H01L 33/58* (2010.01)

(56) References Cited

U.S. PATENT DOCUMENTS

| | | | | |
|---|---|---|---|---|
| 2004/0067025 | A1* | 4/2004 | Haraguchi et al. | 385/49 |
| 2005/0121669 | A1* | 6/2005 | Kobayashi | 257/40 |
| 2006/0125363 | A1* | 6/2006 | Tahira | B41J 2/06 313/29 |
| 2007/0002205 | A1* | 1/2007 | Hasei | G02B 6/0043 349/57 |
| 2007/0249790 | A1* | 10/2007 | Kashiwagi et al. | 525/478 |
| 2007/0278512 | A1* | 12/2007 | Loh et al. | 257/99 |
| 2008/0184809 | A1* | 8/2008 | Shvets | B01L 3/0241 73/861 |
| 2009/0186454 | A1 | 7/2009 | Miyawaki | |
| 2010/0062552 | A1* | 3/2010 | Miyawaki et al. | 438/26 |
| 2012/0326341 | A1* | 12/2012 | Cheng et al. | 264/1.1 |
| 2012/0327149 | A1* | 12/2012 | Mochizuki | B41J 2/04516 347/10 |

FOREIGN PATENT DOCUMENTS

| | | |
|---|---|---|
| JP | 59-225533 A | 12/1984 |
| JP | 59225533 A * | 12/1984 |
| JP | H06 343912 | 12/1994 |
| JP | 2005-101294 A | 4/2005 |
| JP | 2006-066786 A | 3/2006 |
| JP | 2008 03443 | 2/2008 |
| JP | 2008-231199 A | 10/2008 |
| JP | 2009-147281 A | 7/2009 |
| JP | 2010-114406 A | 5/2010 |
| JP | 2010-157608 A | 7/2010 |
| JP | 2011-001418 A | 1/2011 |
| WO | WO 01/88978 | 11/2001 |

OTHER PUBLICATIONS

The extended European Search Report of International Appl. No. PCT/JP2012/060586, mailed Sep. 29, 2014, 6 pages.

* cited by examiner (a)

(b)

(c)

(d)

METHOD AND APPARATUS FOR MANUFACTURING OPTICAL DEVICE

TECHNICAL FIELD

The present invention relates to a method and an apparatus for manufacturing an optical device.

BACKGROUND ART

As an example of an optical device, a lighting device is known in which a lens part is formed by performing resin molding on an LED chip mounted on a substrate, and light emitted from the LED chip is concentrated by the lens part. For example, Patent Literature 1 discloses a method for manufacturing an optical-semiconductor electronic component, which makes it easy to mold a lens shape through encapsulation of a light emitting element by for example, a dispensing method using a silicone resin composition having a specific viscosity and thixotropy.

CITATION LIST

Patent Literature

[PTL 1] JP 2008-231199A

SUMMARY OF INVENTION

Technical Problem

Formation of a lens part by resin potting using a dispenser does not require a molding die, thus making it possible to inexpensively manufacture a lens part in a variety of shapes, whereas it is conventionally difficult to attain the desired accuracy of the lens part shape. Therefore, even when the discharge rate of the dispenser is precisely controlled, the shape of a cured lens part may vary greatly and an improvement is thus required.

Accordingly, an object of the present invention is to provide a method and an apparatus for manufacturing an optical device, by which an optical device having the desired optical properties can be obtained promptly and easily.

Solution to Problem

The aforementioned object of the present invention is achieved by an optical device manufacturing method comprising an encapsulating step of encapsulating a substrate-mounted optical semiconductor element by a liquid resin in a lens shape, and a curing step of curing the liquid resin, wherein in the encapsulating step, a tip of a nozzle of a dispenser is brought close to the optical semiconductor element, and then the liquid resin is supplied while raising the nozzle relative to the substrate.

Alternatively, the aforementioned object of the present invention is achieved by an optical device manufacturing method comprising a first encapsulating step of encapsulating a substrate-mounted optical semiconductor element by a first liquid resin, a first curing step of pre-curing the first liquid resin, a second encapsulating step of encapsulating the pre-cured first liquid resin by a second liquid resin in a lens shape, and a second curing step of main-curing the first liquid resin and the second liquid resin, wherein in the first encapsulating step, a tip of a nozzle of a first dispenser is brought close to the optical semiconductor element, and then the first liquid resin is supplied while raising the nozzle relative to the substrate, and in the second encapsulating step, a tip of a nozzle of a second dispenser is brought close to the first liquid resin, and then the second liquid resin is supplied while raising the nozzle relative to the substrate.

Also, the aforementioned object of the present invention is achieved by an optical device manufacturing apparatus comprising an encapsulating device for encapsulating a substrate-mounted optical semiconductor element by a liquid resin in a lens shape, and a curing device for curing the liquid resin, wherein the encapsulating device comprises a dispenser capable of vertically moving a nozzle for supplying the liquid resin relative to the substrate, and brings a tip of the nozzle close to the optical semiconductor element and then supplies the liquid resin while raising the nozzle relative to the substrate.

Alternatively, the aforementioned object of the present invention is achieved by an optical device manufacturing apparatus comprising a first encapsulating device for encapsulating a substrate-mounted optical semiconductor element by a first liquid resin, a first curing device for pre-curing the first liquid resin, a second encapsulating device for encapsulating the pre-cured first liquid resin by a second liquid resin in a lens shape, and a second curing device for main-curing the first liquid resin and the second liquid resin, wherein the first encapsulating device comprises a first dispenser capable of vertically moving a nozzle for supplying the first liquid resin relative to the substrate, and brings a tip of the nozzle of the first dispenser close to the optical semiconductor element and then supplies the first liquid resin while raising the nozzle relative to the substrate, and the second encapsulating device comprises a second dispenser capable of vertically moving a nozzle for supplying the second liquid resin relative to the substrate, and brings a tip of the nozzle of the second dispenser close to the first liquid resin and then supplies the second liquid resin while raising the nozzle relative to the substrate.

Advantageous Effects of Invention

According to the method and apparatus for manufacturing an optical device of the present invention, an optical device having the desired optical properties can be obtained promptly and easily.

DESCRIPTION OF EMBODIMENTS (First Embodiment)

Figure 1:
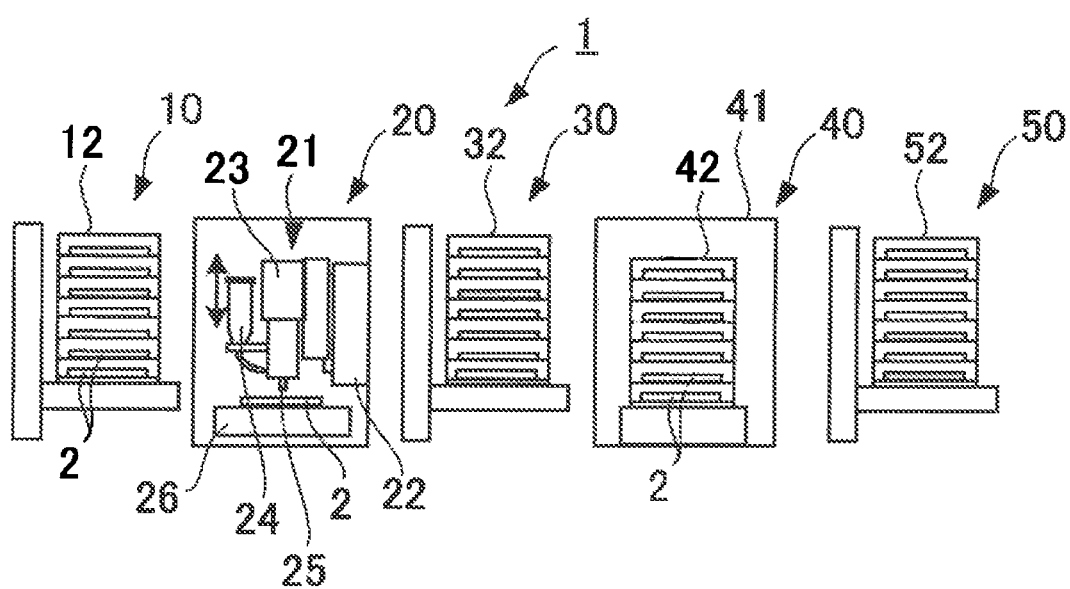
FIG. 1 is a schematic configurational diagram of an optical device manufacturing apparatus according to a first embodiment of the present invention.

Below, an embodiment of the present invention will now be described with reference to the attached drawings. FIG. 1 is a schematic configurational diagram of an optical device manufacturing apparatus according to a first embodiment of the present invention. As shown in FIG. 1, this optical device manufacturing apparatus 1 includes a loader 10, an encapsulating device 20, a buffering device 30, a curing device 40, and an unloader 50. Examples of optical devices manufactured by the optical device manufacturing apparatus 1 include electronic parts having optical semiconductor elements, e.g., light emitting elements such as light emitting diodes (LEDs) and semiconductor lasers or light receiving elements such as photodiodes. The optical device manufactured in this embodiment is a lighting device having a plurality of LED elements. Examples of optical devices having LED elements include, in addition to lighting devices, backlights of liquid crystal televisions, vehicle lamps, signaling devices, and the like.

The loader 10 includes storage cassettes 12 for storing flat-plate substrates 2 on multiple levels, and removes the substrates 2 from the storage cassettes 12 by the action of an arm (not shown) and delivers them to the encapsulating device 20.

The encapsulating device 20 is configured such that a dispenser device 21 for supplying a liquid resin is slidably supported by a support block 22 so as to be vertically movable. As the dispenser device 21, a screw-type dispenser is used in this embodiment, and a screw (not shown) provided inside is driven by the operation of a motor 23, thus allowing the liquid resin stored in a syringe 24 to be discharged from the tip of a nozzle 25. Below the dispenser device 21, an XY table 26 for accommodating a substrate 2 delivered by the loader 10 is provided, and moving the substrate 2 along the horizontal plane makes it possible to supply the liquid resin to multiple places on the upper surface of the substrate 2.

The buffering device 30 includes storage cassettes 32 for storing the substrates 2 on multiple levels, and removes by the action of an arm (not shown) the substrates 2 to which the liquid resin has been supplied in the encapsulating device 20 and stores them in the storage cassettes 32. Then, after a lapse of a specific period of time, the stored substrates 2 are again removed by the action of an arm (not shown) and delivered to the curing device 40.

The curing device 40 includes storage cassettes 42 for storing the substrates 2 on multiple levels in a chamber 41, and the substrates 2 delivered from the buffering device 30 are sequentially stored in the storage cassettes 42. The curing device 40 includes heaters (not shown) placed so as to achieve a uniform temperature distribution inside the chamber, and heats each stored substrate 2 at a pre-set temperature. The curing device 40 may be configured to heat the substrates 2 under ordinary pressure, and the curing device 40 is preferably a pressure oven that is capable of increasing the pressure inside the chamber up to about 0.5 MPa.

The unloader 50 includes storage cassettes 52 for storing the substrates 2 on multiple levels, and removes by an arm (not shown) the substrates 2 stored in the storage cassettes 42 of the curing device 40 after a lapse of a specific period of time, and stores them in the storage cassettes 52.

Next, the operation of the optical device manufacturing apparatus 1 having the above-described configuration will now be described. In the storage cassettes 12 of the loader 10, multiple substrates 2 on which a large number of light emitting elements have been mounted in advance are stored, and the substrates 2 are removed sequentially from the storage cassettes 12 and delivered to the encapsulating device 20.

Figure 2:
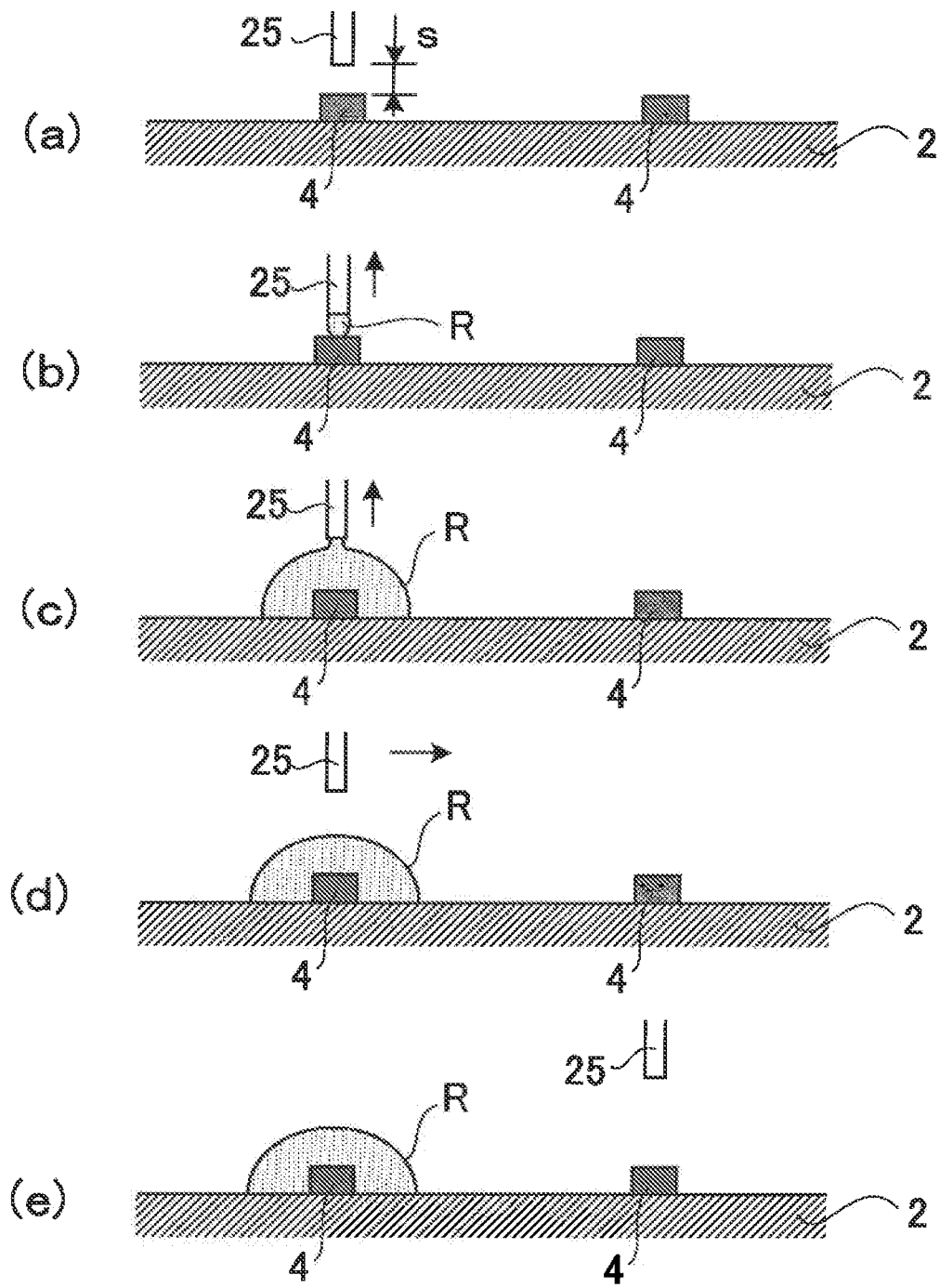
FIG. 2 is a cross-sectional process diagram showing an example of a manufacturing method in which the optical device manufacturing apparatus shown in FIG. 1 is used.

In the encapsulating device 20, the delivered substrate 2 is put on the XY table 26, the substrate 2 is positioned such that the nozzle 25 is placed immediately above a light emitting element 4 that is a subject of encapsulation as shown in FIG. 2(a), and then the dispenser device is lowered to a place where the tip of the nozzle 25 is close to the light emitting element 4. A space s between the tip of the nozzle 25 and the upper surface of the light emitting element 4 when the nozzle 25 is at the near position may be suitably set according to, for example, the viscosity and the amount of the liquid resin supplied, and for example, it is preferably in the range of 0.01 to 3 mm, and more preferably in the range of 0.01 to 1.5 mm. When the dispenser device is of a jet type as will be described below, the space is preferably about 0.1 to 10 mm.

Then, as shown in FIG. 2(b), the dispenser device is raised as a supply of a liquid resin R from the tip of the nozzle 25 begins, and the tip of the nozzle 25 gradually moves away from the light emitting; element 4 while the liquid resin R supplied. Then, as shown in FIG. 2(c), the supply of the livid resin R is terminated when the light emitting element 4 is in a state of being encapsulated by the liquid resin R in a lens shape. The rate of supplying the liquid resin R (the amount of the resin supplied per unit time) may be constant or may be changed while supplying the resin. For example, increasing the rate of supplying the liquid resin R and then terminating supplying can configure the supplied liquid resin R to have a bullet shape. On the other hand, reducing the rate of supplying the liquid resin R and then terminating supplying can configure the upper part of the supplied liquid resin R to have a pointed shape. Changing the rate of supplying the liquid resin R in such a manner while supplying the resin is effective for configuring the liquid resin R, which is for encapsulation of the light emitting element 4, to have the desired shape, but changing the rate is not necessarily limited to this purpose. For example, using a low supply rate immediately after the beginning of supplying the liquid resin R and then increasing the supply rate make it possible to suppress formation of voids (cavities) around the light emitting element 4. Instead of changing the rate of supplying the liquid resin R, changing the rate of raising the nozzle 25 (or the rate of lowering the XY table 26 that retains the substrate 2) while supplying the liquid resin R makes it possible to achieve the same effect as above. For example, in the case of configuring the liquid resin R to have a bullet shape, the rate of raising the nozzle 25 (or the rate of lowering the XY table 26) is reduced while supplying the liquid resin R, and then the supply of the liquid resin R is terminated.

Even after the supply of the liquid resin R is terminated, the nozzle 25 is further raised as shown in FIG. 2(d) until liquid cut-off occurs. Then, after the tip of the nozzle 25 and the lens-shaped liquid resin R are completely separated, the nozzle 25 is placed immediately above the adjacent, unencapsulated light emitting element 4 as shown in FIG. 2(e) by moving the XY table 26. Thereafter, the nozzle 25 is lowered, the above-described procedure is repeated, and thus encapsulation by the liquid resin R is sequentially performed on all light emitting elements 4 mounted on the substrate 2.

The liquid resin R used in the encapsulating device 20 is a translucent resin that is liquid at ordinary temperature, and examples include known encapsulation resins such as epoxy resins, silicone resins, urethane resins, acrylic resins, and polycarbonate resins. For the liquid resin R, it is also possible to use a liquid resin in which a phosphor that absorbs part of light from the light emitting element 4 and emits light with a different wavelength is dispersed in a substantially uniform manner in the aforementioned encapsulation resin. Combination of the light emitting element 4 and the phosphor is not particularly limited, and for example, it is possible to emit white light by a combination of an LED that emits blue light and a BOS phosphor, which is a silicate complex <(Ba,Sr,Ca)$_2$SiO$_4$ complex>. Examples of phosphors include, in addition to the above-described BOS phosphor and a yttrium aluminum garnet (YAG) phosphor, (Y,Gd)$_3$(Al,Ga)$_5$O$_{12}$:Ce, α-SiAlON complex, and Li$_2$SrSiO$_4$ complex having a yellow tinge, (Ba,Sr)$_3$SiO$_5$ complex having an orange tinge, (Ca,Sr)$_2$Si$_5$N$_8$ complex and (Ca,Sr)AlSiN$_3$ complex having a red tinge, (Ba,Sr,Ca)Si$_2$O$_2$N$_2$ complex having a bluish green to yellow tinge, Ca$_3$Sc$_2$Si$_3$O$_{12}$:Ce and CaSc$_2$O$_4$:Ce having a green tinge, and the like.

The substrates 2 discharged from the encapsulating device 20 are delivered to the buffering device 30, stored and left in the storage cassettes 32, and then delivered to the curing device 40. Then, after being stored and heated in the storage cassettes 42 of the curing device 40, the substrates 2 are removed by the unloader 50 and stored in the storage cassettes 52. Removal of the substrates 2 from the storage cassettes 32 and 42 is carried out at a constant rate in order of storage, and thus managed such that the storage time in the buffering device 30 and the heating time in the curing device 40 do not vary between the substrates 2 and last for a specific duration. In this way, optical devices in which the light emitting element 4 is encapsulated by the cured liquid resin R in a lens shape are stored in the storage cassettes 52. Curing of the liquid resin R by the curing device 40 is preferably carried out under pressure of, for example, about 0.5 MPa, and thus, even when air bubbles are contained in the liquid resin R, the volume of the air bubbles is sufficiently reduced, thereby making it possible to suppress variation in the lens shape of the liquid resin R.

According to an optical device manufacturing method in which the optical device manufacturing apparatus 1 of this embodiment is used, the liquid resin R is supplied in the encapsulating device 20 after bringing the tip of the nozzle 25 close to the light emitting element 4 and while raising the nozzle 25, therefore the supplied liquid resin R comes into contact with the light emitting element 4 at an early stage and spreads uniformly due to the surface tension with the surface of the substrate 2, also the tip of the nozzle 25 is unlikely to submerge in the liquid resin R, and a favorable lens shape of the supplied liquid resin R can be maintained. Accordingly, a highly precise lens shape that has the desired optical properties can be obtained promptly and easily. Raising of the nozzle 25 relative to the substrate 2 may be performed in a relative manner, and for example, it is possible to configure that a vertically movable triaxial table is used as the XY table 26 for retaining the substrate 2 and that the liquid resin R is supplied from the nozzle 25 while lowering the substrate 2.

Figure 7:
FIG. 7 is a diagram showing shapes of cured liquid resins varying due to the viscosities of liquid resins.
Figure 7:
Figure 7:
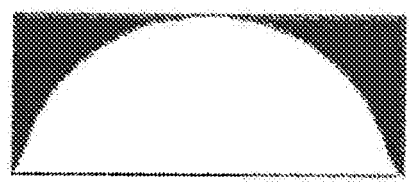
Figure 7:
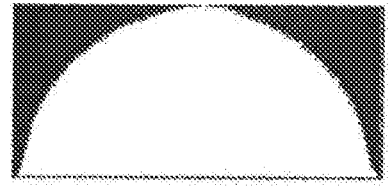

It is preferable that the liquid resin R to be supplied has a high viscosity and a high thixotropy so as to be capable of maintaining the desired lens shape by preventing flattening after being supplied. For example, the liquid resin R configured to have a viscosity (23° C.) in the range of 10 to 300 Pa·s (preferably 10 to 200 Pa·s) and a thixotropy in the range of 2.0 to 7.0 is usable. The thixotropy value is obtained by placing a sample in a glass bottle, leaving it to stand in a water bath at 23° C. for about 1 hour, then measuring its viscosities at 2 rpm and 20 rpm with a Brookfield rotational viscometer, and dividing the viscosity at 2 rpm by the viscosity at 20 rpm. The viscosity of the liquid resin R has a correlation with the shape of the cured liquid resin R. While it is easy to supply the liquid resin R with a low viscosity the lens shape of the liquid resin R becomes flat. On the other hand, with a high viscosity, it is easy to secure the lens height of the liquid resin R and it is also easy to stabilize the shape, and thus the shape after curing can be closer to the desired hemispherical shape (or bullet shape). As examples of shapes of cured liquid resins R varying due to the viscosities of liquid resins R, FIGS. 7(*a*) to (*d*) respectively show cross-sectional shapes of liquid resins R composed of silicone resins having viscosities (23° C.) of 99.2 Pa·s, 122.8 Pa·s, 155.5 Pa·s, and 188.0 Pa·s (all having a thixotropy of about 5.0±0.5). A more specific example of the liquid resin R may preferably be a silica-containing silicone resin composition for light emitting element encapsulation having a viscosity (23° C.) of 10 to 70 Pa·s and a thixotropy of 2.0 to 5.5 as disclosed in JP 2008-231199A.

Also, in this embodiment, because the nozzle 25 is configured to be further raised until liquid cut-off occurs even after the supply of the liquid resin R is terminated, it is unlikely that the liquid resin R encapsulating the light emitting element 4 is pulled and deformed by the movement of the nozzle 25 toward the next light emitting element 4 to be encapsulated, and the lens shape can be maintained reliably. In order to make it easy to remove liquid from the nozzle 25, the screw of the dispenser device may be counter-rotated when the supply of the liquid resin R is terminated. Alternatively, in order to remove liquid from the liquid resin R promptly, it is also effective to move the nozzle 25 in the horizontal direction such that the removal of liquid occurs immediately above the liquid resin R encapsulating the light emitting element 4 by, for example, vibrating or circularly moving the nozzle 25 in the horizontal direction after the supply of the liquid resin R is terminated, and it is thereby possible to promptly and easily obtain the desired lens shape of the liquid resin R that has undergone liquid removal. Such a horizontal movement of the nozzle 25 may be carried out without raising the nozzle 25, or may be carried out while raising the nozzle 25.

The type of the dispenser device 21 is not particularly limited, and in order to reliably supply a fixed amount of the liquid resin R even when it has a high viscosity, a screw type as in this embodiment is preferable. Preferable examples of dispensers for supplying a highly viscous liquid resin include, in addition to a screw type, a jet type that discharges a liquid resin, which has been pressure-fed from a syringe, from a nozzle by the downward movement of a plunger, and a volume-metering type that is capable of fixed-amount discharging.

Figure 8:
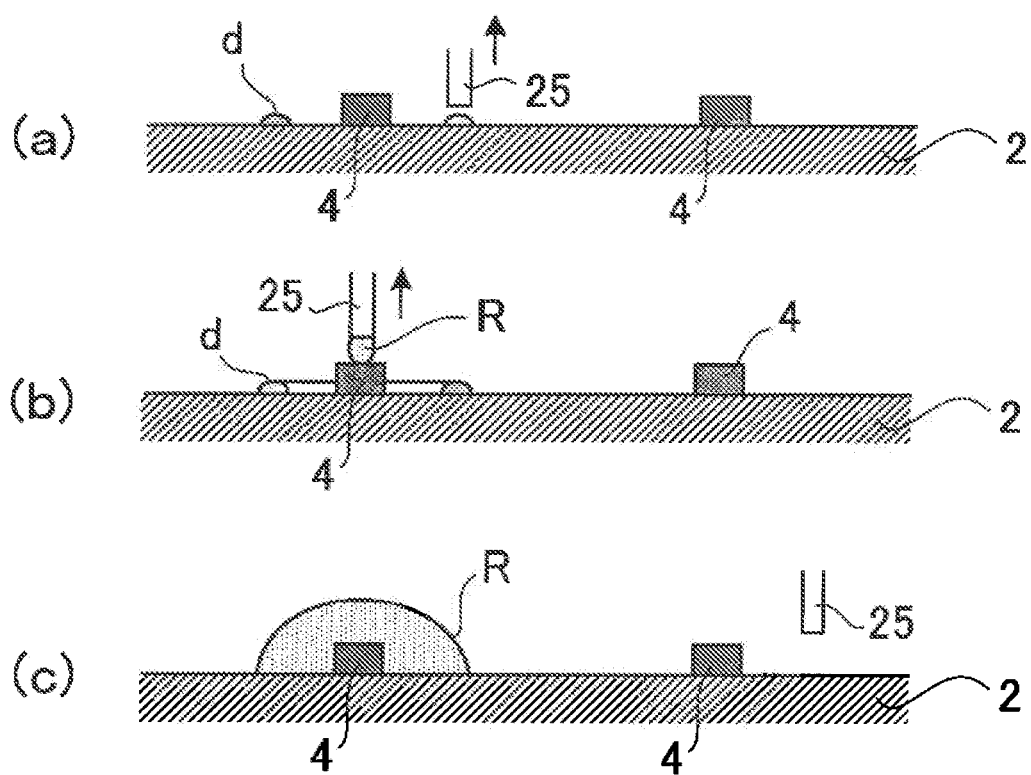
FIG. 8 is a cross-sectional process diagram showing another example of a manufacturing method in which the optical device manufacturing apparatus shown in FIG. 1 is used.

Encapsulation of the light emitting element 4 by the liquid resin R may be carried out in the above-described manner after forming in advance a circular barrier part d on the substrate 2 by supplying a liquid resin while moving the nozzle 25 so as to surround the light emitting element 4 as shown in FIG. 8(*a*) and then moving the nozzle 25 to a place close to the light emitting element 4 and starting supplying the liquid resin R having the same component as the barrier part d as shown in FIG. 8(*b*). In this case, spreading in the horizontal direction of the liquid resin R that encapsulates the light emitting element 4 is regulated by the barrier part d, and therefore, as shown in FIG. 8(c), it is easy to attain the desired lens shape after the liquid resin R and the barrier part d form a single body, and this method is particularly effective when the lens height is large.

Figure 3:
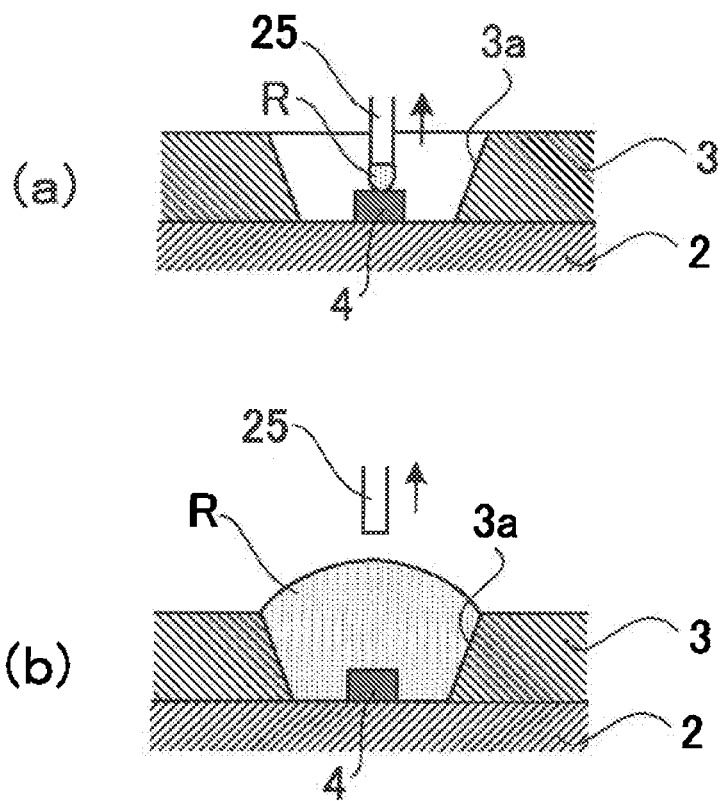
FIG. 3 is a cross-sectional process diagram showing another example of a manufacturing method in which the optical device manufacturing apparatus shown in FIG. 1 is used.

In this embodiment, a case where the light emitting element 4 is mounted on the flat surface of the flat-plate substrate 2 has been described. It is also possible to encapsulate the light emitting element 4 using the optical device manufacturing apparatus 1 of this embodiment for, for example, the flat-plate substrate 2 on the surface of which a frame 3 having a depressed part 3a is provided and the light emitting element 4 is placed inside the depressed part 3a as shown in FIG. 3(a). In this case, the tip of the nozzle 25 is set inside the depressed part 3a at a place lower than the aperture plane of the depressed part 3a, and then the liquid resin R is supplied while raising the nozzle 25 to the outside of the depressed part 3a, thereby making it possible to allow the liquid resin R to bulge outward in a lens shape from the aperture of the depressed part 3a as shown in FIG. 3(b). Moreover, the substrate 2 is not limited to a flat-plate substrate, and the present invention is applicable also to, for example, an optical semiconductor element mounted inside a depressed part of a substrate furnished with a lead frame. It is possible to supply the liquid resin R to the depressed part 3a at a constant supply rate, and it is also possible that a low supply rate is used in the initial stage and then the supply rate is increased. Thereby, it is easy to sufficiently spread the liquid resin R to as far as the lower corners of the depressed part 3a, and formation of voids (cavities) can be suppressed. Instead of increasing the rate of supplying the liquid resin R, the rate of raising the nozzle 25 (or the rate of lowering the XY table 26 retaining the substrate 2) may be reduced.

The optical device manufacturing apparatus 1 of this embodiment can continuously carry out the supply of the liquid resin R to the substrate 2 and the subsequent curing of the liquid resin R. In such an in-line optical device manufacturing apparatus 1, curing of the liquid resin R in the curing device 40 does not necessarily have to be complete curing, and may be pre-curing in which the liquid resin R is cured to such an extent that deformation does not substantially occur over time. Accordingly, the heating time in the curing device 40 can be shortened, and therefore the curing device 40 can be made small with a fewer number of the storage cassettes 42. In this case, the liquid resin R can be main-cured by introducing the substrate 2 removed from the curing device 40 again into a heating furnace in a subsequent process. Note that it is possible that the optical device manufacturing apparatus 1 has a batch-wise configuration.

Figure 9:
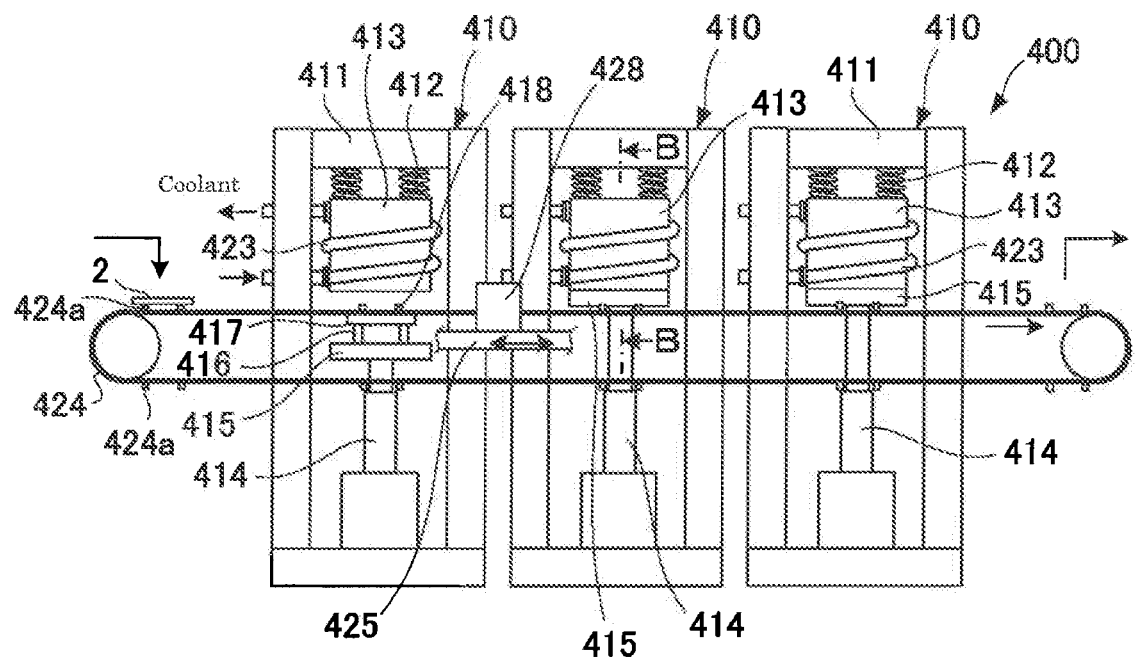
FIG. 9 is a front view showing an example of a heat curing device for use in the optical device manufacturing apparatus shown in FIG. 1.

The curing device 40 can be configured to perform heating under ordinary pressure or under increased pressure as stated above, and is preferably a device that performs heating under increased pressure to suppress quality deterioration due to expansion of air bubbles present in the liquid resin R. FIG. 9 is a front view showing an example of such a curing device, and FIG. 10 is a cross-sectional diagram taken along the line B-B in FIG. 9.

A curing device 400 shown in FIG. 9 includes a plurality of pressure curing furnaces 410 that are arranged so as to be adjacent in the horizontal direction. Each pressure curing furnace 410 includes a cylindrical casing 413 supported by a top board 411 via cushioning members 412 composed of compression springs, and a lower lid 415 provided at the upper end of a vertically movable rod of a vertically movable cylinder 414 composed of, for example, an air cylinder. The casing 413 is placed such that the lower side opens, and the lower lid 415 ascends from the lower position indicated by the broken line in FIG. 10, thus making it possible to tightly close the casing 413.

Figure 10:
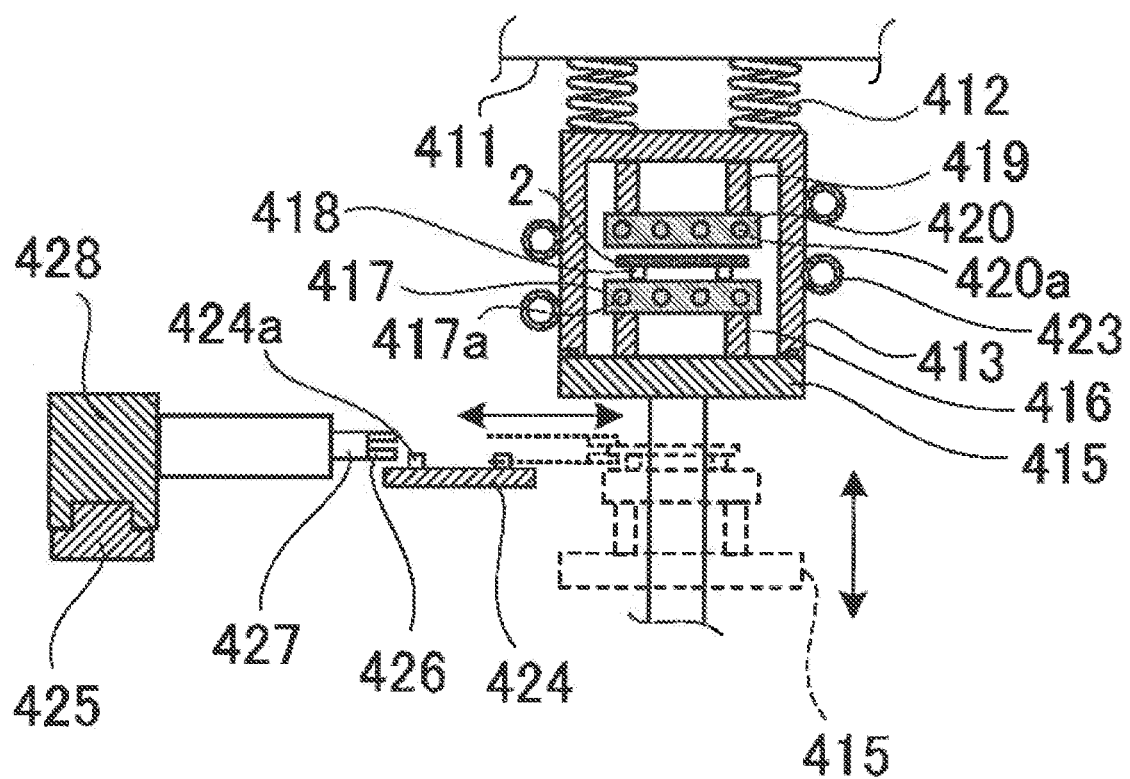
FIG. 10 is a cross-sectional diagram taken along the line B-B in FIG. 9.

As shown in FIGS. 9 and 10, a heating element 417 is supported by the upper surface of the lower lid 415 via supporting members 416, and a plurality of pins 418 capable of accommodating the substrate 2 are provided on the upper surface of the heating element 417. On the other hand, a heating element 420 is supported in a suspended manner by the upper surface of the inner wall of the casing 413 via supporting Members 419. The heating elements 417 and 420 are placed so as to be spaced apart and face each other when the lower lid 415 is in a state in which the casing 413 is tightly closed, and this can uniformly heat the substrate 2 placed on the pins 418 from above and below. Although the heating elements 417 and 420 in FIG. 9 are metal heater blocks including a plurality of cartridge heaters 417a and 420a, the heating elements may be other electrothermal heaters such ceramic heaters, or the heating elements may be configured to send hot air inside the casing 413.

A pressurizing pipe (not shown) is connected to the casing 413, and it is thus possible, by supplying compressed air from a pressurizing source, to pressurize the inside of the casing 413 that is in a tightly closed state at the desired pressure (for example, 0.5 MPa). The pressure inside the casing 413 can be released to the atmosphere by operating a valve on a pressure release pipe (not shown) connected to the casing 413. The temperature inside the casing 413 can be adjusted by controlling electricity sent to the heating elements 417 and 420, or by allowing a coolant to travel through a cooling pipe 423 spirally wound around the outer circumferential surface of the casing 413.

The curing device 400 includes a delivery conveyor 424 that horizontally delivers the substrate 2 in the direction of arrangement of the pressure curing furnaces 410, and a guide rail 425 (shown only partially in FIG. 9) placed so as to extend in parallel with this delivery conveyor 424. The delivery conveyor 424 has support parts 424a that are composed of a plurality of pins and are provided at equal intervals on the delivery surface, and delivers the substrate 2 such that it is possible, after the liquid resin-supplied substrate 2 from the previous process (for example, the buffering device 30 shown in FIG. 1) is received by a support part 424a, that the substrate 2 is passed in the vicinity of the pressure curing furnaces 410 and handed over to the subsequent process (for example, the unloader 50 shown in FIG. 1). A movable body 428 including an extendable rod 427 the tip of which has an air chuck 426 for grasping the substrate 2 is slidably supported by the guide rail 425, and as shown in FIG. 10, by stopping the movable body 428 in front of any pressure curing oven 410 and advancing and retracting the extendable rod 427, the substrate 2 can be transferred between the delivery conveyor 424 and the lower lid 415 (broken line) that is in the lower position. Placement and removal of the substrate 2 in and from the pressure curing oven 410 can he also performed using another transfer device such as a material handling robot in place of the delivery conveyor 424 and the movable body 428 of this embodiment.

According to the above-described curing device 400, the substrate 2 delivered by the delivery conveyor 424 is placed on the pins 418 of the pressure curing furnace 410 by the action of the movable body 428, and then delivered to the inside of the casing 413 by raising the lower lid 415, thus making it possible to perform pre-curing on the liquid resin supplied to the substrate 2 at a specific temperature and pressure for a specific period of time. After the end of pre-curing, the lower lid 415 is lowered, and the substrate 2 again is moved onto the delivery conveyor 424 by the action of the movable body 428 for delivery. In order to make the time from the substrate 2 being placed on the delivery conveyor 424 until being accommodated in the casing 413 uniform, after the substrate 2 is transferred to the lower lid 415 from the delivery conveyor 424, the raising of the lower lid 415 may be suspended until a waiting time that is set in advance for each pressure curing furnace 410 elapses, thereby making it possible to enhance the dimensional accuracy of the lens shape of the liquid resin.

(Second Embodiment)

Figure 4:
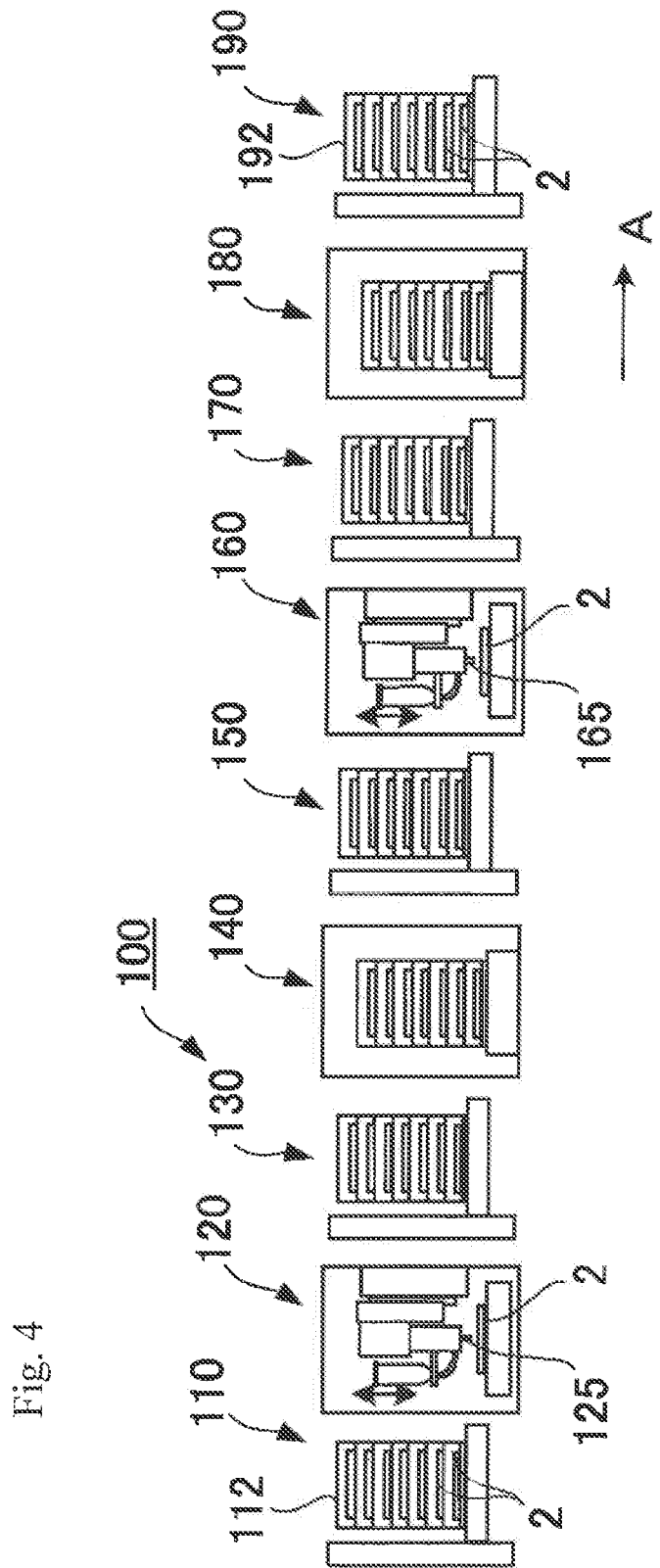
FIG. 4 is a schematic configurational diagram of an optical device manufacturing apparatus according to a second embodiment of the present invention.

FIG. 4 is a schematic configurational diagram of an optical device manufacturing apparatus according to a second embodiment of the present invention. As shown in FIG. 4, this optical device manufacturing apparatus 100 includes a loader 110, a first encapsulating device 120, a first buffering device 130, a first curing device 140, a second buffering device 150, a second encapsulating device 160, a third buffering device 170, a second curing device 180, and an unloader 190. The first encapsulating device 120 and the second encapsulating device 160 are configured in the same manner as the encapsulating device 20 of the first embodiment, and include nozzles 125 and 165 for supplying a liquid resin, respectively. Also, the first buffering device 130, the second buffering device 150, and the third buffering device 170 have the same configuration as the buffering device 30 of the first embodiment, and the first curing device 140 and the second curing device 180 have the same configuration as the curing device 40 of the first embodiment. Substrates 2 stored in storage cassettes 112 of the loader 110 are sequentially delivered by the operation of an arm (not shown) in the direction of arrow A in FIG. 4 and stored in storage cassettes 192 of the unloader 190.

In this optical device manufacturing apparatus 100, a light emitting element 4 is encapsulated by a first liquid resin in a lens shape by the first encapsulating device 120 as in the case of the encapsulating device 20 of the fast embodiment. Then, with the first liquid resin being in a pre-cured state through the first buffering device 130, the first curing device 140, and the second buffering device 150, the substrate is delivered to the second encapsulating device 160.

Figure 5:
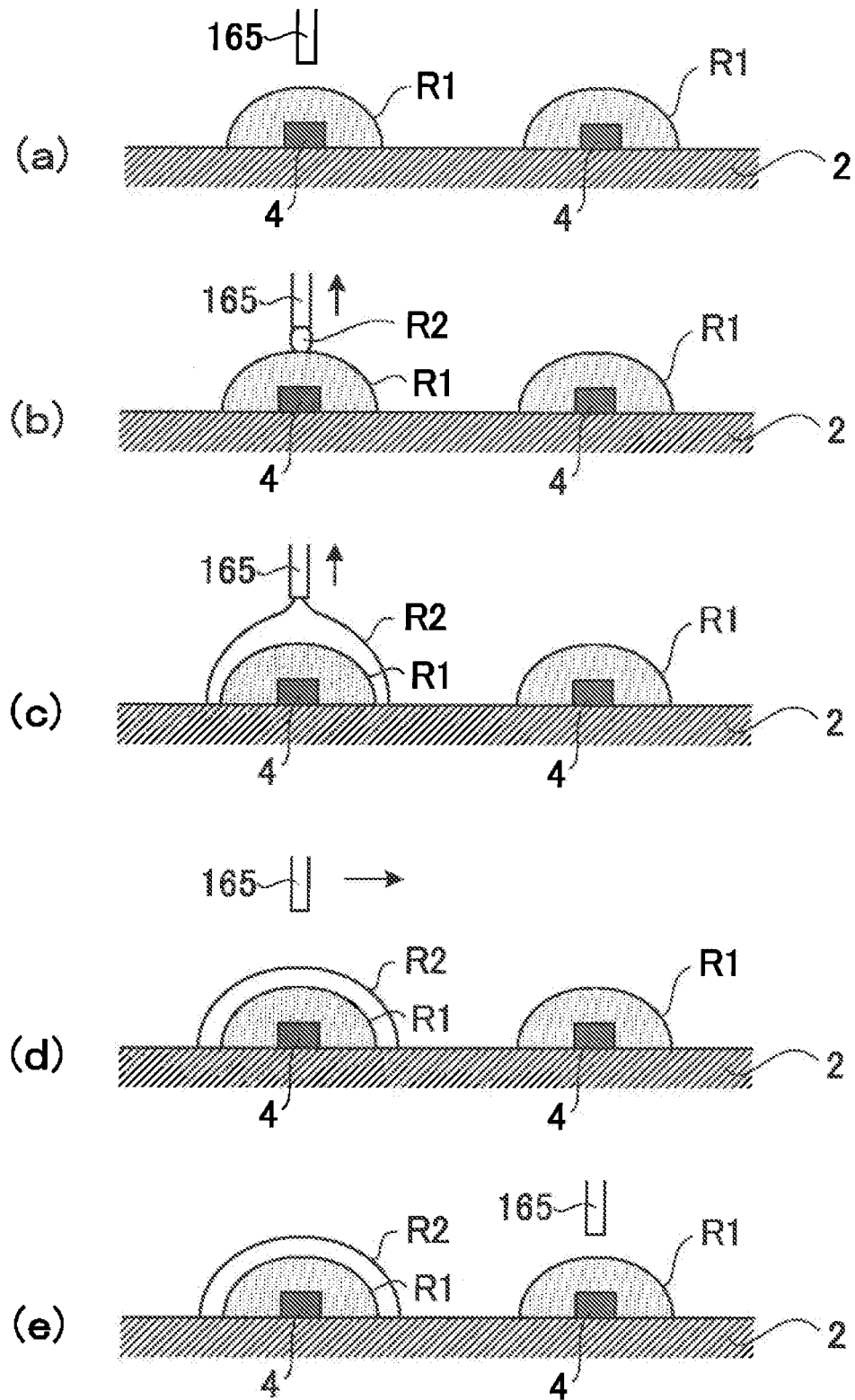
FIG. 5 is a cross-sectional process diagram showing an example of a manufacturing method in which the optical device manufacturing apparatus shown in FIG. 4 is used.

In the second encapsulating device 160, the delivered substrate 2 is put on an XY table, and as shown in FIG. 5(a), the substrate 2 is positioned such that the nozzle 165 is placed immediately above the light emitting element 4, and then a dispenser device is lowered to a place where the tip of the nozzle 165 is close to a first liquid resin R1 encapsulating the light emitting element 4. It is preferable that the space between the tip of the nozzle 165 in the near position and the first liquid resin R1 is set to be comparable to the space s shown in FIG. 2(a).

Then, as shown in FIG. 5(b), the dispenser device is raised as the supply of a second liquid resin R2 from the tip of the nozzle 165 begins, and the tip of the nozzle 165 gradually moves away from the first liquid resin R1 while the second liquid resin R2 is supplied. Then, as shown in FIG. 5(c), the supply of the second liquid resin R2 is terminated when the first liquid resin R1 is in a state of being encapsulated by the second liquid resin R2 in a lens shape.

Even after the supply of the second liquid resin R2 is terminated, the nozzle 165 is further raised as shown in FIG. 5(d) until liquid cut-off occurs. Then, after the tip of the nozzle 165 and the lens-shaped second liquid resin R2 are completely separated, the nozzle 165 is moved to immediately above the adjacent light emitting element 4 as shown in FIG. 5(e) by moving an XY table. Thereafter, the nozzle 165 is lowered, the above-described procedure is repeated, and thus the first liquid resin R1 on all light emitting elements 4 mounted, on the substrate 2 is further encapsulated by the second liquid resin R2. Thereafter, via the third buffering device 170, main-curing is carried out in the second curing device 180, thereby making it possible to obtain a light emitting device in which the first liquid resin R1 and the second liquid resin R2 are completely cured.

According to the optical device manufacturing apparatus 100 of this embodiment, since the second liquid resin R2 is supplied after the first liquid resin R1 is pre-cured, it is possible to suppress deformation of the first liquid resin R1 that occurs due to the weight of the second liquid resin R2, and prevent the first liquid resin R1 and the second liquid resin R2 from being mixed. It is therefore possible to promptly and easily obtain the desired lens shape of the second liquid resin R2.

A combination of the first liquid resin R1 and the second liquid resin R2 is not particularly limited, and for example, using a phosphor-containing material as the first liquid resin R1 and on the other hand a phosphor-free material as the second liquid resin R2 makes it possible to obtain a high-intensity light emitting device while suppressing the amount of phosphor used. Alternatively, it is possible to use a phosphor-free material as the first liquid resin R1 and on the other hand a phosphor-containing material as the second liquid resin R2.

In this embodiment, the first liquid resin R1 is encapsulated by the second liquid resin R2 in a lens shape, and also the light emitting element 4 is encapsulated by the liquid resin R1 in a lens shape, but since the shape of the first liquid resin R1 does not directly influence the final lens shape, the first liquid resin R1 may have a shape other than a lens shape. For example, a low-viscosity material may be used for the first liquid resin R1, and the first liquid resin R1 covering the light emitting element 4 may have a thin-film-like flat shape.

Figure 6:
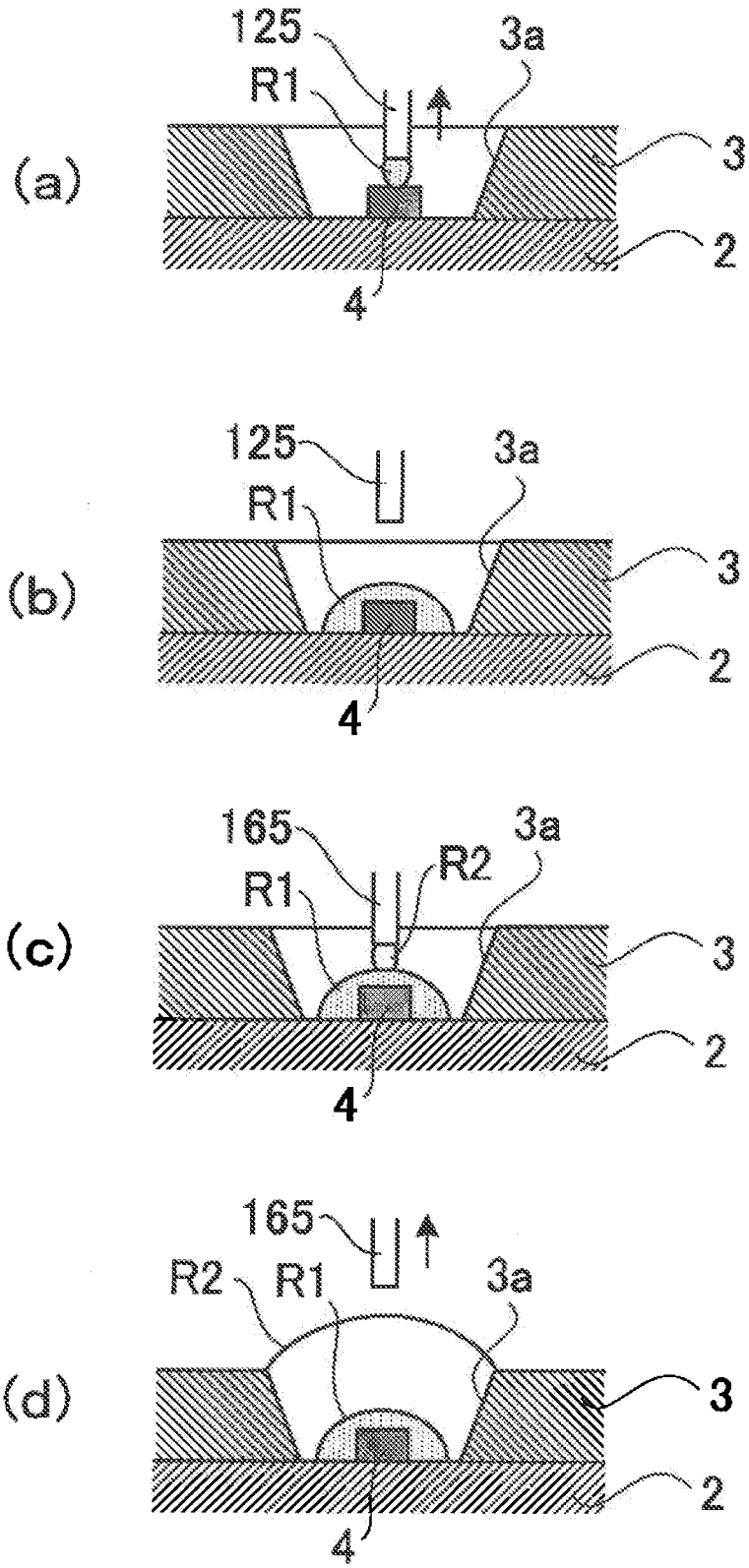
FIG. 6 is a cross-sectional process diagram showing another example of a manufacturing method in which the optical device manufacturing apparatus shown in FIG. 4 is used.

As in the first embodiment, in this embodiment also, it is possible to encapsulate the light emitting element 4 mounted inside a depressed part 3a of the substrate 2 by the first liquid resin R1 and the second liquid resin R2. First, in the first encapsulating device 120, as shown in FIG. 6(a), the tip of the nozzle 125 is set inside the depressed part 3a, then the first liquid resin R1 is supplied while raising the nozzle 125, and thus, as shown in FIG. 6(b), the light emitting element 4 is encapsulated by the first liquid resin R1 within the depressed part 3a. Then, in the second encapsulating device 160, as shown in FIG. 6(c), the tip of the nozzle 165 is set inside the depressed part 3a, then the second liquid resin R2 is supplied while raising the nozzle 165 to the outside of the depressed part 3a, and thus, as shown in FIG. 6(d), it is possible to allow the second liquid resin R2 to bulge outward in a lens shape from the aperture of the depressed part 3a.

In addition, various modifications presented in the first embodiment are also suitably applicable to the second embodiment.

REFERENCE SIGNS LIST 1,100 Optical device manufacturing apparatus
2 Substrate
4 Light emitting element (optical semiconductor element)
20 Encapsulating device
25,125,165 Nozzle
40 Curing device
120 First encapsulating device
140 First curing device
160 Second encapsulating device
180 Second curing device

The invention claimed is:

1. An optical device manufacturing method comprising:
   encapsulating a substrate-mounted optical semiconductor element by a liquid resin in a lens shape; and
   curing the liquid resin, wherein
   in the encapsulating step, a tip of a nozzle of a dispenser is brought close to the optical semiconductor element, the nozzle begins to be raised relative to the substrate as a supply of the liquid resin begins, and then the liquid resin is supplied while raising the nozzle relative to the substrate, and
   wherein in the encapsulating step, a rate of raising the nozzle relative to the substrate is changed during the supply of the liquid resin performed while raising the nozzle relative to the substrate.

2. The optical device manufacturing method according to claim 1, wherein the encapsulating step comprises a step of further raising the nozzle until liquid cut-off occurs after a supply of the liquid resin is terminated.

3. The optical device manufacturing method according to claim 1, wherein the optical semiconductor element is placed inside a depressed part of the substrate, and the encapsulating step comprises a step of raising the tip of the nozzle from inside the depressed part.

4. The optical device manufacturing method according to claim 1, wherein the encapsulating step comprises a step of moving the nozzle in a horizontal direction after a supply of the liquid resin is terminated such that liquid cut-off occurs immediately above the liquid resin supplied to the substrate.

5. The optical device manufacturing method according to claim 1, wherein the encapsulating step comprises a step of forming in advance a circular barrier part on the substrate by supplying the liquid resin while moving the nozzle so as to surround the optical semiconductor element.

6. The optical device manufacturing method according to claim 1, wherein the encapsulating step comprises a step of changing a supply rate while supplying the liquid resin.

7. The optical device manufacturing method according to claim 1, wherein the curing step is carried out under increased pressure.

8. The optical device manufacturing method according to claim 1, wherein the liquid resin has a viscosity at 23° C. of 10 to 200 Pa·s and a thixotropy of 2.0 to 7.0.

9. The optical device manufacturing method according to claim 1, wherein the dispenser is any of a screw type, a jet type, and a volume-metering type.

10. The optical device manufacturing method according to claim 1, wherein in the encapsulating step, a rate of supplying the liquid resin is changed during the supply of the liquid resin performed while raising the nozzle relative to the substrate.

* * * * *